(12) United States Patent
Wang et al.

(10) Patent No.: US 8,013,622 B1
(45) Date of Patent: Sep. 6, 2011

(54) MEASURING APPARATUS FOR ELECTROMAGNETIC INTERFERENCE

(75) Inventors: Jun-Wei Wang, Shenzhen (CN); Chun-Hung Chen, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/871,858

(22) Filed: Aug. 30, 2010

(30) Foreign Application Priority Data

Aug. 19, 2010 (CN) .................. 2010 1 0257421.4

(51) Int. Cl.
*G01R 31/302* (2006.01)
(52) U.S. Cl. ................ 324/754.29; 324/258; 324/260
(58) Field of Classification Search ............ 324/750.26, 324/750.27, 754.29, 258
See application file for complete search history.

(56) References Cited

U.S. PATENT DOCUMENTS

| 4,704,614 | A  | * | 11/1987 | Poirier et al. ................. 343/703 |
| 6,914,571 | B1 | * | 7/2005  | Lemanczyk et al. .......... 343/703 |
| 7,109,725 | B2 | * | 9/2006  | Maurice ........................ 324/637 |
| 7,276,921 | B2 | * | 10/2007 | Perry ........................ 324/750.27 |
| 7,298,155 | B2 | * | 11/2007 | Fuchiyama et al. ..... 324/750.26 |
| 7,358,749 | B2 | * | 4/2008  | Kazama et al. .......... 324/754.27 |
| 7,541,818 | B2 | * | 6/2009  | Kosaka et al. ........... 324/754.29 |
| 7,924,232 | B2 | * | 4/2011  | Kajiwara et al. .............. 343/703 |
| 2003/0052395 | A1 | * | 3/2003 | Nakamura et al. ............. 257/678 |

* cited by examiner

*Primary Examiner* — Huy Q Phan
*Assistant Examiner* — Richard Isla Rodas
(74) *Attorney, Agent, or Firm* — Altis Law Group, Inc.

(57) ABSTRACT

A measuring apparatus includes a measuring body and a probe device. The probe device includes a dome-shaped metal shield, a probe, and a cable. The metal shield defines an opening in a bottom of the shield. The probe is mounted inside the metal shield. A first end of the cable is connected to the probe, and a second end of the cable passes through a top of the metal shield and then is connected to the measuring body.

5 Claims, 4 Drawing Sheets

MEASURING APPARATUS FOR ELECTROMAGNETIC INTERFERENCE

BACKGROUND

1. Technical Field

The present disclosure relates to measuring apparatuses and, particularly, to a measuring apparatus for electromagnetic interference (EMI).

2. Description of Related Art

At present, electronic products need to be tested for EMI before the electronic products are sold. However, traditional measuring apparatuses may experience EMI from surrounding products, resulting in inaccurate test results from the product being tested. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
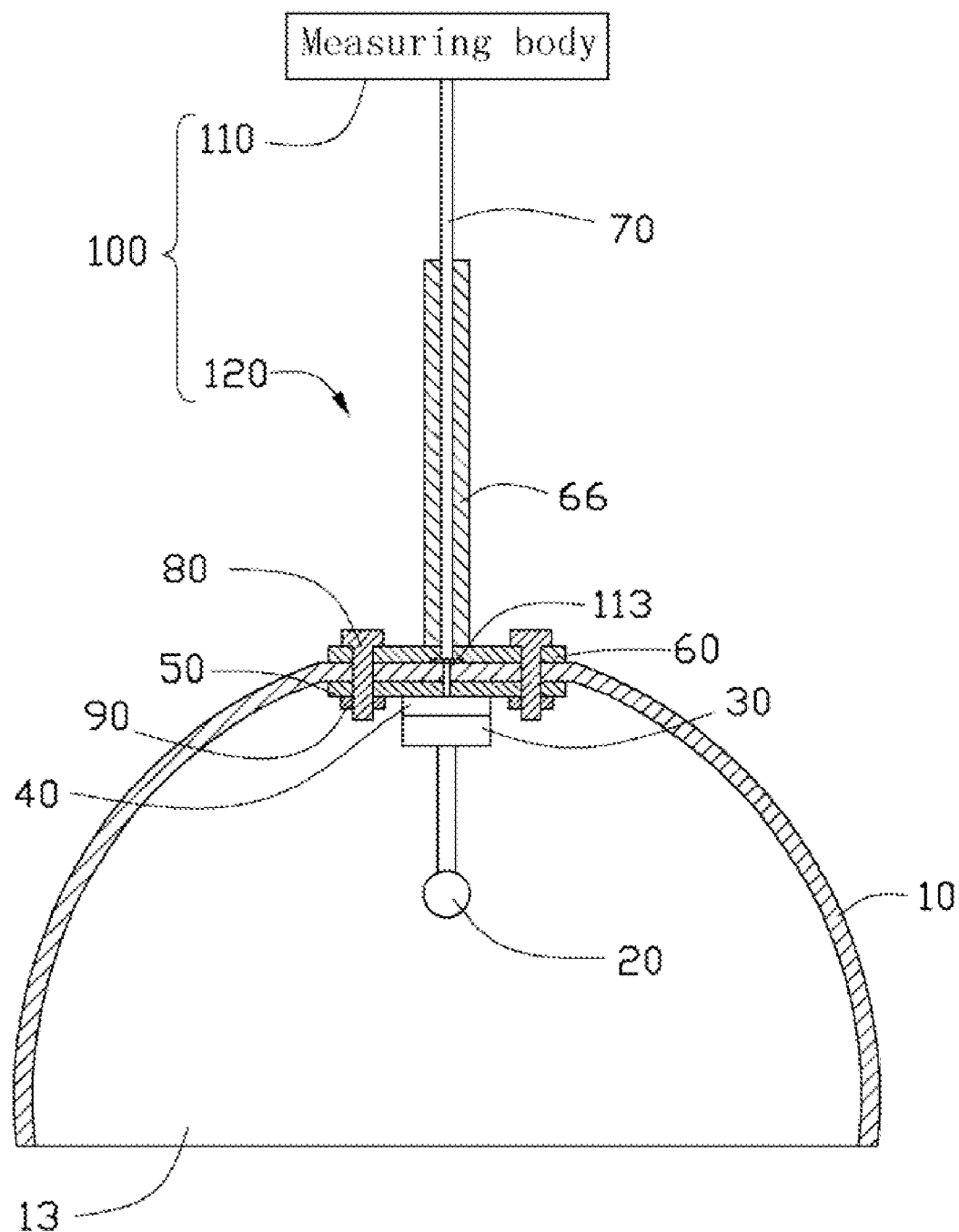
FIG. 1 is a cross-sectional view of an exemplary embodiment of a measuring apparatus for electromagnetic interference (EMI), the measuring apparatus includes a probe device.
Figure 2:
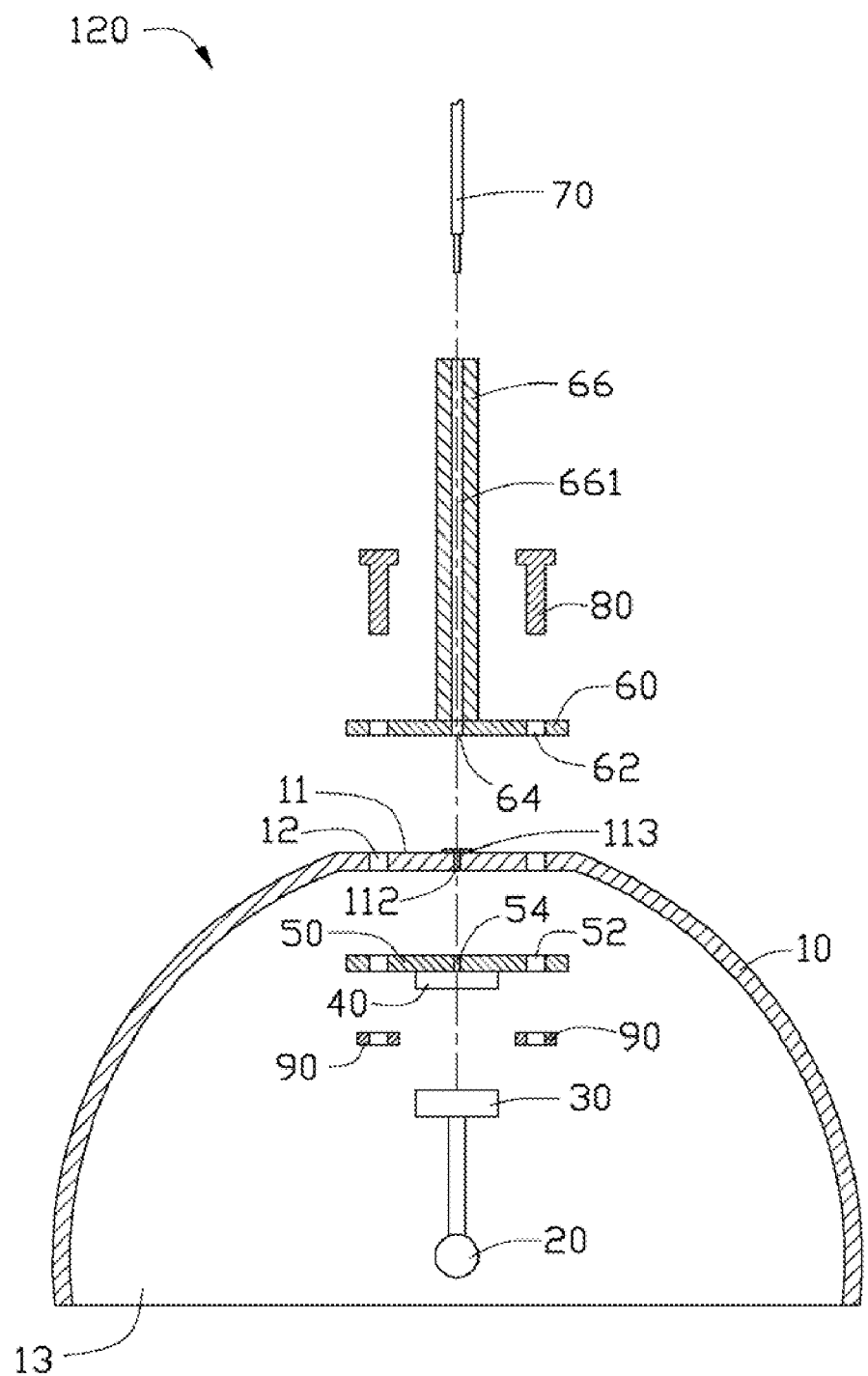
FIG. 2 is an exploded, cross-sectional view of the probe device of FIG. 1, the probe device includes a metal shield and a coaxial cable.
Figure 3:
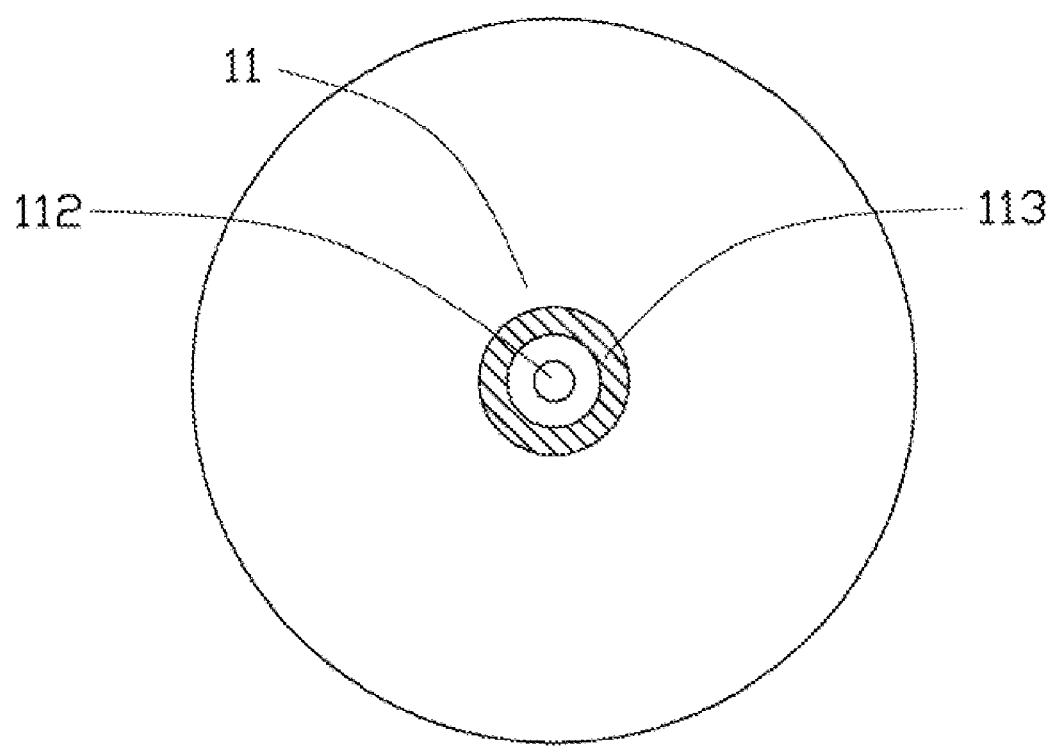
FIG. 3 is a cross-sectional view of a top of the metal shield of FIG. 2.
Figure 4:
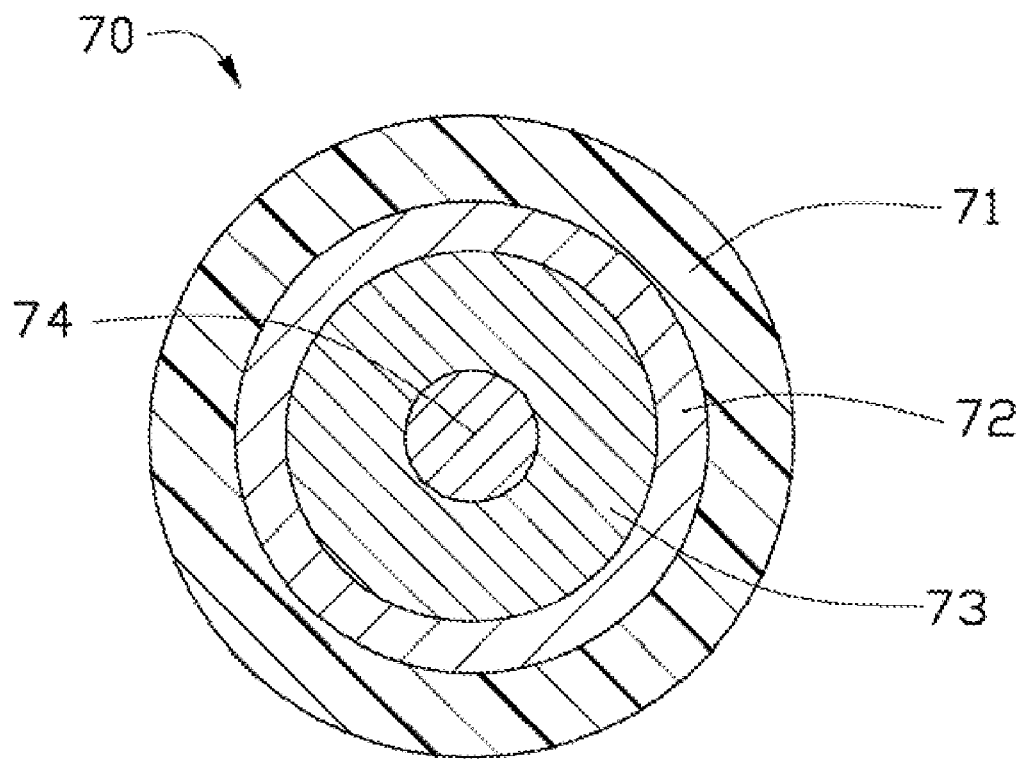
FIG. 4 is a cross-sectional view of the coaxial cable of FIG. 2.

Referring to FIGS. 1 to 4, an embodiment of a measuring apparatus 100 for electromagnetic interference (EMI), includes a measuring body 110 and a probe device 120. The measuring body 110 is a known measuring device, such as a spectrum analyzer, and theory of the measuring device is known. The probe device 120 includes a dome-shaped metal shield 10 with an opening 13 defined in a bottom opposite to a top 11, a probe 20, a female sub-miniature-A (SMA) connector 30, a first fixing piece 50, a male SMA connector 40, a handle 66, a second fixing piece 60, a coaxial cable 70, screws 80, and nuts 90. The female SMA connector 30 is connected to the probe 20. The male SMA connector 40 is positioned against the first fixing piece 50. The handle 66 is fixed to the second fixing piece 60.

A center hole 112 is defined in the center of the top 11 of the metal shield 10. A ring-shaped conductor 113 is set on the top 11 of the metal shield 10 and surrounds the center hole 112. Through holes 12 are defined in the top 11, at opposite sides of the center hole 112. A through hole 54 is defined in a center of the first fixing piece 50. Positioning holes 52 are defined in the first fixing piece 50, at opposite sides of the through hole 54. A through hole 64 is defined in the center of the second fixing piece 60. Fixing holes 62 are defined in the second fixing piece 60, at opposite sides of the through hole 64. Each fixing hole 62 corresponds to a through hole 12 of the top 11 of the metal shield 10 and a positioning hole 52 of the first fixing piece 50. A through hole 661 is defined in a center of the handle 66. The through hole 661 responds to the through hole 64 of the second fixing piece 60, the center hole 112 of the top 11 of the metal shield 10, and the through hole 54 of the first fixing piece 50. In one embodiment, an inner surface of the metal shield 10 is coated with microwave absorbing material. The conductor 113 is one of ordinary wire, conductive foam, conductive fabric, conductive clips, conductive plastic, copper, and aluminum.

The coaxial cable 70 includes a protective layer 71, a shielding layer 72, an insulating layer 73, and a line core 74. At a distal end of the coaxial cable 70, the protective layer 71 and the shielding layer 72 are stripped to expose the insulating layer 73.

In assembly, the insulation exposed end of the cable 70 passes through the through hole 661 of the handle 66 and the through hole 64 of the second fixing piece 60, and then through the conductor 113, the center hole 112 of the metal shield 10, and through hole 54 of the first fixing piece 50. The exposed shielding layer 72 of the cable 70 at the conjunction of the distal end and the cable 70 resists against and is electrically connected to the conductor 113 of the top 11 of the metal shield 10, to make the metal shield 10 shield external magnetic field. The line core 74 of the stripped end of the cable 70 is inserted into the male SMA connector 40. A second end of the cable 70 is connected to the measuring body 110. The screws 80 pass through the fixing holes 62 of the second fixing piece 60, the through holes 12 of the top 11 of the metal shield 10, and the positioning holes 52 of the first fixing piece 50, to engage in the nuts 90. The female SMA connector 30 is connected to the male SMA connector 40.

In use, the probe device 120 can be used to find out whether EMI points produce EMI exceeding a standard value of the electronic device being tested. The user grips the handle 66 of the probe device 120, with the opening 13 of the metal shield 10 aligning towards the electronic device. The probe 20 can only receive EMI from the electronic device that aligns with the opening 13 of the metal shield 10 because the probe 20 is placed inside the metal shield 10. The metal shield 10 can shield EMI from outside sources of other devices that are not directly aligned with the opening 13 of the metal shield 10. When the probe device 120 detects an EMI radiation point of the electronic device, EMI from the EMI radiation point is transmitted to the measuring body 110 through the probe 20, the female SMA connector 30, the male SMA connector 40, and the coaxial cable 70. The measuring body 110 processes the received EMI and displays a result to the user, to determine whether the detected EMI radiation point is in accordance with a standard value. Test theories of other EMI radiation points of the electronic device are the same.

The measuring apparatus 100 can shield EMI from external devices that are not aligned with the opening 13 of the metal shield 10. Therefore, if EMI of an electronic device exceeds a standard value, the disqualified EMI radiation point can be ascertained accurately by using the measuring apparatus 100.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A measuring apparatus for electromagnetic interference (EMI), the measuring apparatus comprising:
   a measuring body; and
   a probe device comprising:
   a dome-shaped metal shield defining an opening in a bottom of the shield;
   a probe mounted inside the metal shield;
   a cable, a first end of the cable connected to the probe, and a second end of the cable passing through a top of the metal shield and then connected to the measuring body;
   a first connector connected to the probe;
   a first fixing piece attached to an inner surface of the top of the metal shield;
   a second connector set on the first fixing piece opposite to the top of the metal shield and engaging with the first connector;
   a second fixing piece attached to an outer surface of the top of the metal shield; and
   a handle fixed on the second fixing piece opposite to the top of the metal shield,
   wherein a first through hole is defined in a center of the top of the metal shield, a conductor is set on the outer surface of the top of the metal shield and surrounds the first through hole, a second through hole is defined in a center of the first fixing piece, a third through hole is defined in a center of the second fixing piece, a fourth through hole is defined in a center of the handle, wherein the first end of the cable passes through the fourth through hole, the third through hole, the first through hole, and the second through hole to be electronically connected to the second connector, wherein the cable comprises a line core and a shielding layer coating the line core, the line core is electrically connected to the first connector, the shielding layer is electrically connected to the conductor at the top of the metal shield.

2. The measuring apparatus of claim 1, wherein the first connector is a female sub-miniature-A (SMA) connector, and the second connector is a male SMA connector.

3. The measuring apparatus of claim 1, wherein the cable is a coaxial cable, the cable further comprises an insulating layer coating the line core and coated by the shielding layer, and a protective layer coating the shielding layer.

4. The measuring apparatus of claim 3, wherein the protective layer and the shielding layer at the first end of the cable is cut away, with the shielding layer exposed at the first end to electrically contact the conductor at the top of the metal shield.

5. The measuring apparatus of claim 1, wherein an inner surface of the metal shield is coated with microwave absorbing material.

* * * * *